United States Patent
Knappich

(10) Patent No.: US 8,704,195 B2
(45) Date of Patent: Apr. 22, 2014

(54) METHOD FOR SETTING A POSITION OF A CARRIER ELEMENT IN A PARTICLE BEAM DEVICE

(71) Applicant: Carl Zeiss Microscopy GmbH, Jena (DE)

(72) Inventor: Matthias Knappich, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/854,187

(22) Filed: Apr. 1, 2013

(65) Prior Publication Data
US 2014/0001373 A1    Jan. 2, 2014

(30) Foreign Application Priority Data
Mar. 30, 2012   (DE) .................. 10 2012 205 317

(51) Int. Cl.
*H01J 37/20*    (2006.01)
(52) U.S. Cl.
CPC ..................................... *H01J 37/20* (2013.01)
USPC .................................................... 250/442.11
(58) Field of Classification Search
USPC .................................................... 250/442.11
See application file for complete search history.

(56) References Cited

U.S. PATENT DOCUMENTS 6,444,991 B1    9/2002  Yamada et al.
7,791,043 B2 *  9/2010  Seya et al. ................ 250/442.11

FOREIGN PATENT DOCUMENTS

| DE | 600 29 166 T2 | 6/2007 |
| DE | 10 2010 020 550 A1 | 12/2010 |
| DE | 10 2009 028 600 A1 | 3/2011 |
| EP | 1 071 112 B1 | 7/2006 |

OTHER PUBLICATIONS

Deben UK Limited, "High precision SEM laser state specifications," Bury St. Edmunds (UK), Jan. 2008, 2 pp.
T. Hopkins, "Stepper Motor Controller/Driver Simplifies Stepper Motor System," Power Electronics Technology, Aug. 2010, 4 pp.
Faulhaber Miniature Drive Systems, "Stepper Motors—PRECIstep Technology," http://www.faulhaber.com/n170258/n.html, accessed Mar. 11, 2013, 2 pp.

* cited by examiner

*Primary Examiner* — Kiet T Nguyen
(74) *Attorney, Agent, or Firm* — Muirhead and Saturnelli, LLC

(57) ABSTRACT

A method is provided for setting a position of a carrier element, arranged in a particle beam device, that holds an object. The particle beam device has a beam generator for generating a particle beam and an objective for focusing the particle beam. The carrier element is movable using a first stepper motor. A movement of the carrier element is started by actuating the first stepper motor using a first motor current in the form of an alternating current. The first motor current is set to a first frequency and a first amplitude. The movement of the carrier element is decelerated by reducing the first frequency and by reducing the first amplitude of the first motor current. The first frequency is reduced to zero during a first period of time. The first amplitude is reduced to an amplitude of a first holding current during the first period of time.

21 Claims, 4 Drawing Sheets

METHOD FOR SETTING A POSITION OF A CARRIER ELEMENT IN A PARTICLE BEAM DEVICE

TECHNICAL FIELD

This application relates to a method for setting a position of a carrier element which is arranged in a particle beam device. By way of example, the carrier element can in this case be designed as a movably arranged sample stage, on which a sample (object) to be examined and/or to be processed is arranged.

BACKGROUND OF THE INVENTION

The prior art has disclosed a particle beam device, for example a scanning electron microscope or an ion beam device, which is provided with a sample stage, on which an object to be examined and/or to be processed is arranged. The sample stage has a movable design, wherein the movable design of the sample stage is ensured by a plurality of movement elements, from which the sample stage is composed. The movement elements enable a movement of the sample stage in at least one specific direction. In particular, sample stages are known which have a plurality of translational movement elements (for example approximately 3-4 translational movement elements) and a plurality of rotational movement elements (for example 2-3 rotational movement elements). By way of example, a sample stage is movably arranged along a first translation axis (for example an x-axis), along a second translation axis (for example a y-axis) and along a third translation axis (for example a z-axis). The first translation axis, the second translation axis and the third translation axis are oriented perpendicular to one another. Furthermore, the sample stage is rotatably arranged about a first rotation axis and about a second rotation axis, which is perpendicular to the first rotation axis.

The driving force for a movement by means of the movement elements is provided by stepper motors in the prior art. Respectively one stepper motor is provided for respectively one movement along one of the translation axes or for one rotation about one of the rotation axes. Here, the stepper motors can be arranged within a vacuum chamber of a particle beam device, or else be arranged outside of the vacuum chamber of the particle beam device. In the latter case, corresponding vacuum feed-throughs and mechanical apparatuses are provided for ensuring the actuation between the stepper motors and the sample stage.

A stepper motor known from the prior art has the following basic design. The stepper motor is provided with a rotor, which is rotatably arranged in the stepper motor. Furthermore, the stepper motor has coils, which are arranged about the rotor. The coils provide a controlled, incrementally rotating electromagnetic field, by means of which the rotor can be rotated about a minimal angle or about a multiple of this minimal angle. This renders it possible to obtain a certain number of steps per rotation of the rotor. The prior art has disclosed stepper motors with different numbers of steps per rotation of the rotor, for example with 100 steps per rotation. In the case of a stepper motor with 100 steps per rotation, the rotor in each case rotates by 3.6 degrees in one full step.

A so-called micro-step operation is also possible in known stepper motors in addition to an operation in which the stepper motor carries out full steps. In the micro-step operation, smaller steps than a full step are provided. To this end, the step angle is reduced. This is provided by an actuation of the motor current for the coils used in the stepper motor. By switching the motor current on or off at the individual coils of the stepper motor, a step-like overall control current profile is obtained, which is provided by the relationships of the amplitude of the motor current applied to the individual coils. Hence, the stepper motor is actuated by a selectable actuation of the motor current for the individual coils used in the stepper motor. As a result of a selectable phase-shifted actuation of the motor current for the individual coils of the stepper motor, it is possible to obtain full steps or smaller steps (for example half steps, eighth steps or smaller steps). The amplitude of the first motor current, which is applied to a first coil of a stepper motor, and the amplitude of a second motor current, which is applied to a second coil of the stepper motor, do not depend on the step size (i.e., for example, a full step, a half step or any other step) and are therefore always the same for each selected step width.

It is desirable in a particle beam device for the positional setting of the sample stage to be as accurate as possible. This is desirable, in particular for a high resolution or for accurate imaging of an object (sample) arranged on the sample stage. If the micro-step operation is now used in a stepper motor, this can lead to problems in setting the position of the sample stage when the stepper motor is stopped. For stopping purposes, the rotor of the stepper motor is decelerated. This means that, when the sample stage is decelerated (and accordingly also when the sample stage is stopped), the frequency of the motor current for actuating the individual coils is reduced to zero. The frequency of the motor current for the stepper motor is a measure for the speed of the stepper motor, and hence also a measure for the speed of the sample stage. When the stepper motor is stopped, the rotor stops in a predeterminable position, which is predetermined by one of the micro-steps. In this position, the motor current assumes a value, which is predetermined by an operational amplitude and an operational phase of the motor current, for the stepper motor, required in this motor position. This operational amplitude is static. It can lead to an excessive thermal load on the stepper motor, which is undesirable. It is for this reason that provision is made in the prior art for the amplitude of the motor current to be reduced to a predeterminable holding amplitude after stopping. The motor current having this holding amplitude is also referred to as a holding current. In the case of the holding current, the heating of the components is at acceptable levels.

In respect of the prior art, reference is made to DE 10 2009 028 600 A1 and DE 10 2010 020 550 A1.

However, as a result of the existing electromagnetic fields, the rotor of the stepper motor moves slightly in the direction of the next full step when the motor current is reduced to the predeterminable holding amplitude. This also moves the sample stage. Accordingly, this leads to an additional, undesired movement and to an undesired position of the sample stage. The object arranged on the sample stage may be positioned incorrectly.

Accordingly, it is desirable, firstly, for the position of the sample stage to be able to be driven at accurately and without undesired additional movement and, secondly, for the position of the sample stage always to be known with great accuracy. Thus, it would be desirable to specify a method by means of which this can be achieved.

SUMMARY OF THE INVENTION

According to the system described herein, a method is provided for setting a position of a carrier element, which is arranged in a particle beam device. The carrier element is also referred to as sample stage or else as object stage. The carrier element is designed to hold an object which is to be examined and/or processed. The particle beam device has at least one beam generator for generating a particle beam and at least one objective for focusing the particle beam. By way of example, the particle beam is used to examine and/or process the object.

The carrier element is designed in a movable fashion by means of at least one first stepper motor. The method according to the invention comprises the following steps:

starting a movement of the carrier element by actuating the first stepper motor using a first motor current in the form of an alternating current, setting the first motor current to a first frequency and to a first amplitude, and decelerating the movement of the carrier element by reducing the first frequency and by reducing the first amplitude of the first motor current, wherein the first frequency is reduced to zero during a first predeterminable period of time, and wherein the first amplitude is reduced to an amplitude of a predeterminable first holding current during the first predeterminable period of time.

The system described herein proceeds from the following surprising discovery. During the micro-step operation of the first stepper motor in particular, the first amplitude of the first motor current is also changed during a deceleration process of the first stepper motor, in which the first frequency of the first motor current is reduced during the deceleration period of time and set to zero. During the deceleration process, the first amplitude is reduced until the holding current is reached. The first stepper motor is stationary at this holding current. Thus, the actuation of the first motor current for obtaining a holding position (i.e. the reduction of the amplitude of the motor current to the holding current) takes place while the first stepper motor still is in motion. The system described herein first of all renders it possible that the first stepper motor (and hence also the carrier element) stops at a desired position and that there is no more movement of the first stepper motor in the direction of the next full step. Furthermore, the system described herein secondly renders it possible that the first stepper motor does not attain high temperatures. The reduction in the first frequency and/or in the first amplitude can occur abruptly during the first predeterminable period of time (i.e. at a specific time during the first predeterminable period of time) or can occur continuously over the first predeterminable period of time. By way of example, the first motor current is fed in a phase-offset fashion to coils which are contained in the first stepper motor.

Reference is explicitly made to the fact that the sequence of the method steps explained both above and below is arbitrary. Any suitable sequence of the method steps can be used.

In one embodiment of the method according to the invention, provision is additionally or alternatively made for the starting of the movement of the carrier element to comprise an acceleration during a second predeterminable period of time. The first motor current is actuated using a first acceleration frequency and using a first acceleration amplitude during the second predeterminable period of time, wherein the first acceleration frequency and the first acceleration amplitude are changed, for example by being increased, during the second predeterminable period of time until the first frequency and the first amplitude are set. Here, provision is made for the first frequency to be greater than the first acceleration frequency and for the first amplitude to be greater than the first acceleration amplitude. In one exemplary embodiment, provision is made for the change in the first acceleration amplitude to take place continuously or abruptly during the second predeterminable period of time.

In a further exemplary embodiment of the method according to the invention, provision is alternatively or additionally made for the first frequency and/or the first amplitude to be kept constant during a third predeterminable period of time.

In an in turn further exemplary embodiment of the method according to the invention, provision is additionally or alternatively made for the carrier element to be moved along at least one translation axis. By way of example, provision is made for the carrier element to be moved along at least one first translation axis and along at least one second translation axis. In this exemplary embodiment, movements are provided in a plane which is spanned by the first translation axis and the second translation axis. By way of example, provision is additionally or alternatively made for the first translation axis and the second translation axis to be oriented perpendicular to one another. In a further exemplary embodiment, provision is made for the carrier element to be moved along a third translation axis. By way of example, provision is made for the carrier element to be moved along the first translation axis, along the second translation axis and/or along the third translation axis. In particular, provision is made for the first translation axis, the second translation axis and/or the third translation axis to be oriented perpendicular to one another.

In an in turn further exemplary embodiment of the method according to the invention, provision is additionally or alternatively made for the carrier element to be rotated about at least one first rotation axis and/or about at least one second rotation axis. By way of example, provision is made for the first rotation axis and the second rotation axis to be oriented perpendicular to one another.

Reference is explicitly made to the fact that the number of translation axes and the number of rotation axes are not restricted to the aforementioned numbers. Rather, any number of translation axes and any number of rotation axes can be used for the method according to the invention.

In an in turn further exemplary embodiment of the method according to the invention, provision is additionally or alternatively made for a plurality of stepper motors to be used for the carrier element. Thus, for example, provision is made for the carrier element to be moved along the first translation axis by means of the first stepper motor. Furthermore, provision is made, for example, for the carrier element to be moved along the second translation axis by means of a second stepper motor. Additionally, or as an alternative thereto, provision is made for the carrier element to be moved along the third translation axis by means of a third stepper motor.

In an exemplary embodiment of the method according to the invention, the actuation of the second stepper motor and/or of the third stepper motor is like in the case of the first stepper motor. Thus, provision is additionally or alternatively made for a movement of the carrier element to be started by actuating the second stepper motor using a second motor current in the form of an alternating current. Furthermore, the second motor current is set to a second frequency and to a second amplitude. Moreover, provision is also made for decelerating the movement of the carrier element by reducing the second frequency and by reducing the second amplitude of the second motor current. Here, the second frequency is reduced to zero during a fourth predeterminable period of time and the second amplitude is reduced to an amplitude of a predeterminable second holding current during the fourth predeterminable period of time. Here too, provision is made for the reduction in the second frequency and/or in the second amplitude to be able to occur abruptly during the fourth predeterminable period of time (i.e. at a specific time during the fourth predeterminable period of time). As an alternative to this, provision is made for the reduction in the second frequency and/or in the second amplitude to occur continuously over the fourth predeterminable period of time. By way of example, the second motor current is fed in a phase-offset fashion to coils which are contained in the second stepper motor.

In a further embodiment of the method according to the invention, provision is now additionally or alternatively made for a movement of the carrier element to be started by actuating the third stepper motor using a third motor current in the form of an alternating current. The third motor current is then set to a third frequency and to a third amplitude. Moreover, the movement of the carrier element is decelerated by reducing the third frequency and by reducing the third amplitude of the third motor current, wherein the third frequency is reduced to zero during a fifth predeterminable period of time and wherein the third amplitude is changed to an amplitude of a predeterminable third holding current during the fifth predeterminable period of time. The reduction in the third frequency and/or in the third amplitude can occur abruptly during the fifth predeterminable period of time (i.e. at a specific time during the fifth predeterminable period of time). As an alternative to this, provision is made for the reduction in the third frequency and/or in the third amplitude to occur continuously over the fifth predeterminable period of time. By way of example, the third motor current is fed in a phase-offset fashion to coils which are contained in the third stepper motor.

In an in turn further exemplary embodiment of the method according to the invention, provision is additionally or alternatively made for the period of time of starting a movement of the second stepper motor to be embodied in a specific way. Thus, in this exemplary embodiment, the starting of the movement of the carrier element comprises an acceleration during a sixth predeterminable period of time. The second motor current is actuated using a second acceleration frequency and using a second acceleration amplitude during the sixth predeterminable period of time. The second acceleration frequency and the second acceleration amplitude are changed, for example by being increased, during the sixth predeterminable period of time until the second frequency and the second amplitude are set. The second frequency is greater than the second acceleration frequency and the second amplitude is greater than the second acceleration amplitude. In an exemplary embodiment, provision is made for the change in the second acceleration amplitude to occur continuously or abruptly during the sixth predeterminable period of time.

In an in turn further exemplary embodiment of the method according to the invention, provision is additionally or alternatively made for the start phase of the movement of the third stepper motor also to be embodied in a specific way. Thus, provision is for example made for the starting of the movement of the carrier element to comprise an acceleration during a seventh predeterminable period of time. The third motor current is actuated using a third acceleration frequency and using a third acceleration amplitude during the seventh predeterminable period of time. The third acceleration frequency and the third acceleration amplitude are changed, for example by being increased, during the seventh predeterminable period of time until the third frequency and the third amplitude are set. The third frequency is greater than the third acceleration frequency and the third amplitude is greater than the third acceleration amplitude. In an exemplary embodiment, provision is made for the change in the third acceleration amplitude to occur continuously or abruptly during the seventh predeterminable period of time.

In an in turn further exemplary embodiment of the method according to the invention, provision is additionally or alternatively made for the second frequency and/or the second amplitude to be kept constant over an eleventh period of time. By way of example, provision is additionally or alternatively also made for the third frequency and/or the third amplitude to be kept constant over a twelfth predeterminable period of time.

In an in turn further exemplary embodiment of the method according to the invention, provision is additionally or alternatively made for the carrier element to be rotated about the first rotation axis by means of a fourth stepper motor. Additionally or alternatively, provision is made in the method according to the invention for the carrier element to be rotated about the second rotation axis by means of a fifth stepper motor.

The actuation of the fourth stepper motor and/or of the fifth stepper motor for example takes place in an analogous fashion to the actuation of at least one of the stepper motors already mentioned above. Thus, in the method according to the invention, provision is additionally or alternatively made for a movement of the carrier element to be started by actuating the fourth stepper motor using a fourth motor current in the form of an alternating current. The fourth motor current is then set to a fourth frequency and to a fourth amplitude. Moreover, the movement of the carrier element is decelerated by reducing the fourth frequency and by reducing the fourth amplitude. The fourth frequency is reduced to zero during an eighth predeterminable period of time. Furthermore, the fourth amplitude is reduced to an amplitude of a predeterminable fourth holding current during the eighth predeterminable period of time. The reduction in the fourth frequency and/or in the fourth amplitude can occur abruptly during the eighth predeterminable period of time (i.e. at a specific time during the eighth predeterminable period of time). As an alternative to this, provision is made for the reduction in the fourth frequency and/or in the fourth amplitude to occur continuously over the eighth predeterminable period of time. By way of example, the fourth motor current is fed in a phase-offset fashion to coils which are contained in the fourth stepper motor.

In addition or as an alternative thereto, provision is made for a movement of the carrier element to be started by actuating the fifth stepper motor using a fifth motor current in the form of an alternating current. Furthermore, the fifth motor current is additionally or alternatively set to a fifth frequency and to a fifth amplitude. Moreover, the movement of the carrier element is decelerated by reducing the fifth frequency and by reducing the fifth amplitude of the fifth motor current, wherein the fifth frequency is reduced to zero during a ninth predeterminable period of time and wherein the fifth amplitude is reduced to an amplitude of a predeterminable fifth holding current during the ninth predeterminable period of time. Here too, the reduction in the fifth frequency and/or in the fifth amplitude can occur abruptly during the ninth predeterminable period of time (i.e. at a specific time during the ninth predeterminable period of time). As an alternative to this, provision is made for the reduction in the fifth frequency and/or in the fifth amplitude to occur continuously over the ninth predeterminable period of time. By way of example, the fifth motor current is fed in a phase-offset fashion to coils which are contained in the fifth stepper motor.

In an exemplary embodiment of the method according to the invention, provision is additionally or alternatively made for the fourth frequency and/or the fourth amplitude to be kept constant over a thirteenth predeterminable period of time. By way of example, provision is additionally or alternatively made for the fifth frequency and/or the fifth amplitude to be kept constant over a predeterminable fourteenth period of time.

In a further embodiment of the method according to the invention, provision is additionally or alternatively made for the starting of a movement of the carrier element to comprise an acceleration during a tenth predeterminable period of time. The fourth motor current is actuated using a fourth acceleration frequency and using a fourth acceleration amplitude during the tenth predeterminable period of time. The fourth acceleration frequency and the fourth acceleration amplitude are changed, for example by being increased, during the tenth predeterminable period of time until the fourth frequency and the fourth amplitude are set. The fourth frequency is greater than the fourth acceleration frequency and the fourth amplitude is greater than the fourth acceleration amplitude. In an exemplary embodiment, provision is made for the change in the fourth acceleration amplitude to occur continuously or abruptly during the tenth predeterminable period of time.

In an in turn further exemplary embodiment of the method according to the invention, provision is additionally or alternatively made for the starting of the movement of the carrier element to comprise an acceleration during a fifteenth predeterminable period of time. The fifth motor current is actuated using a fifth acceleration frequency and using a fifth acceleration amplitude during the fifteenth predeterminable period of time. The fifth acceleration frequency and the fifth acceleration amplitude are changed, for example by being increased, during the fifteenth predeterminable period of time until the fifth frequency and the fifth amplitude are set. The fifth frequency is greater than the fifth acceleration frequency. Furthermore, the fifth amplitude is greater than the fifth acceleration amplitude. In an exemplary embodiment, provision is made for the change in the fifth acceleration amplitude to occur continuously or abruptly during the fifteenth predeterminable period of time.

Reference is explicitly made to the fact that at least two, for example all, of the aforementioned stepper motors can have an identical design. By way of example, provision is additionally or alternatively made for at least two of the aforementioned stepper motors (for example all of the aforementioned stepper motors) to be operated with the same motor current. By way of example, it is also possible for at least two of the aforementioned periods of time to be identical.

In a further exemplary embodiment of the method according to the invention, provision is additionally or alternatively made for the position of the carrier element to be measured and for the position of the carrier element, established by the measurement, to be used for actuating at least one of the aforementioned stepper motors. To this end, provision is made for the particle beam device to have at least one measurement apparatus for measuring the position of the carrier element and at least one control unit for setting the position of the carrier element by actuating at least one of the aforementioned stepper motors. By way of example, this exemplary embodiment renders possible a regulated actuation of the position of the carrier element. As an alternative to this, provision is made for the position of the carrier element to be actuated without regulation.

The system described herein also relates to a computer program product, having a program code, which can be loaded (or is loaded) into a control processor of a particle beam device and which, when executed on the control processor, controls the particle beam device in such a way that a method with at least one of the aforementioned method steps or a combination of at least two of the aforementioned method steps can be carried out.

The system described herein also relates to a particle beam device, with at least one beam generator for generating a particle beam, with at least one objective lens for focusing the particle beam on an object, with at least one detector for detecting interaction particles and/or interaction radiation, which are generated when the particle beam is incident on the object, with at least one carrier element for arranging the object and with at least one stepper motor for moving the carrier element. Furthermore, the particle beam device has at least one control processor, which comprises a computer program product with at least one of the aforementioned features. By way of example, the particle beam device has at least one measurement apparatus for measuring the position of the carrier element and at least one control unit for setting the position of the carrier element by actuating at least one of the aforementioned stepper motors.

Furthermore, the system described herein also relates to a particle beam device, with at least one beam generator for generating a particle beam, with at least one objective lens for focusing the particle beam on an object, with at least one detector for detecting interaction particles and/or interaction radiation, which are generated when the particle beam is incident on the object, with at least one carrier element for arranging the object and with at least one stepper motor for moving the carrier element. The particle beam device, for example a control processor of the particle beam device, is configured in such a way that a movement of the carrier element is started by actuating the first stepper motor using a first motor current in the form of an alternating current, that the first motor current is set to a first frequency and to a first amplitude, and that the movement of the carrier element is decelerated by reducing the first frequency and by reducing the first amplitude of the first motor current, wherein the first frequency is reduced to zero during a first predeterminable period of time and wherein the first amplitude is reduced to an amplitude of a predeterminable first holding current during the first predeterminable period of time. Exemplary embodiments of this particle beam device provide for the particle beam device to be configured in such a way that a method with at least one of the aforementioned method steps or a combination of at least two of the aforementioned method steps can be carried out.

BRIEF DESCRIPTION OF THE DRAWINGS

Embodiments of the system described herein will be explained in more detail herein on the basis of the figures, which are briefly described as follows.

DETAILED DESCRIPTION OF VARIOUS EMBODIMENTS

Figure 1:
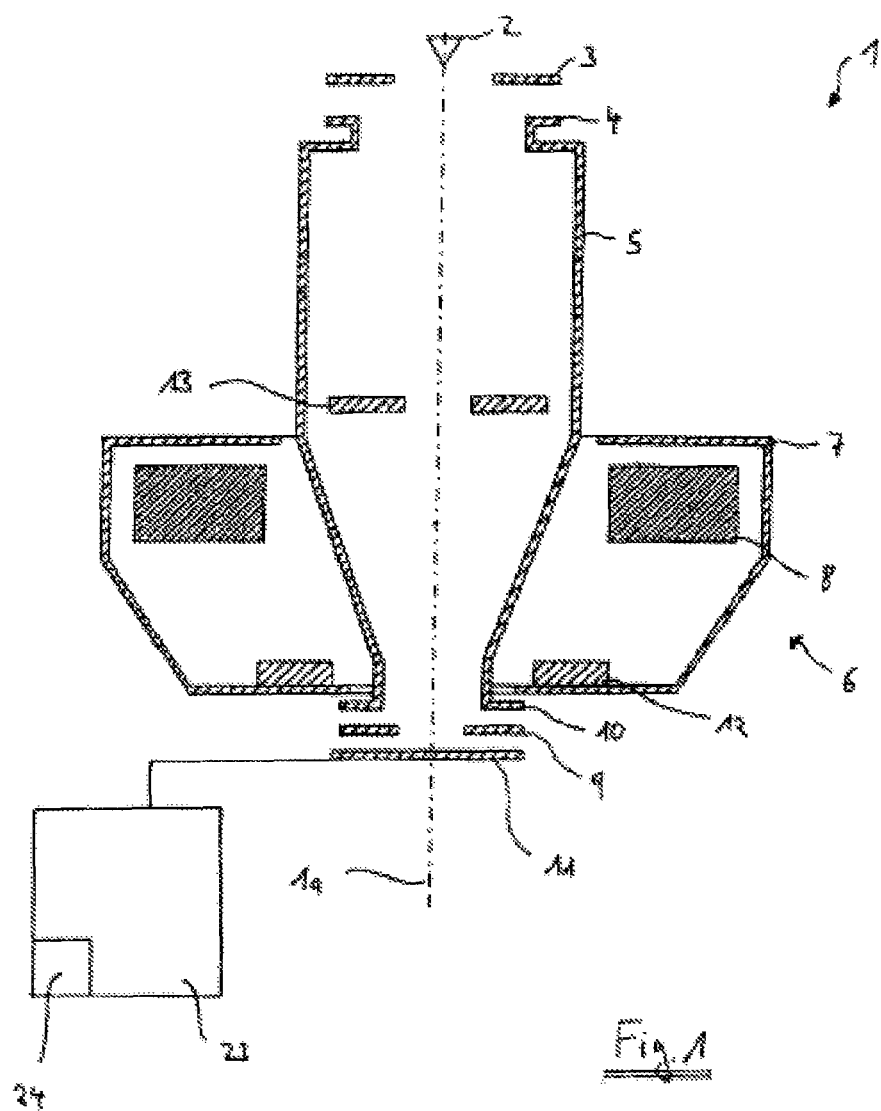
FIG. 1 shows a schematic illustration of a particle beam device.

FIG. 1 shows a schematic illustration of a particle beam column 1 of a particle beam device, which column is embodied as an electron column and, in principle, corresponds to an electron column of a scanning electron microscope. However, reference is already explicitly made here to the fact that the invention is not restricted to a scanning electron microscope. Rather, the invention can be used in any particle beam device, in particular in an ion beam device.

The particle beam column 1 has an optical axis 1a, a beam generator in the form of an electron source 2 (cathode), an extraction electrode 3 and an anode 4, which at the same time forms one end of a beam guiding tube 5. By way of example, the electron source 2 is a thermal field emitter. Electrons which emerge from the electron source 2 are accelerated to an anode potential as a result of a potential difference between the electron source 2 and the anode 4. Accordingly, a particle beam in the form of an electron beam is provided.

Furthermore, the particle beam column 1 has an objective lens 6. The objective lens 6 is provided with a bore, through which the beam guiding tube 5 is routed. The objective lens 6 furthermore has a pole piece 7, in which coils 8 are arranged.

Connected downstream of the beam guiding tube 5 is an electrostatic retardation apparatus. The latter consists of an individual electrode 9 and a tube electrode 10. The tube electrode 10 is applied to the end of the beam guiding tube 5 adjacent to a carrier element 11. The carrier element 11 will be discussed in still more detail below. Together with the beam guiding tube 5, the tube electrode 10 lies at the anode potential. By contrast, the individual electrode 9 and a sample arranged on the carrier element 11 lie at a low potential compared to the anode potential. This is how the electrons of the particle beam can be decelerated to a desired energy required for examining a sample arranged on the carrier element 11. The particle beam column 1 moreover has a scanning apparatus 12, by means of which the particle beam can be deflected and scanned over a sample arranged on the carrier element 11.

For imaging purposes, secondary electrons and/or backscattered electrons are detected by means of a detector arranged in the beam guiding tube 5, which secondary electrons and/or backscattered electrons are generated as a result of the interaction of the particle beam with a sample arranged on the carrier element 11. The signals generated by the detector 13 are transmitted to an electronics unit (not illustrated) for imaging purposes.

In the following text, the carrier element 11 will now be discussed in more detail. The carrier element 11 is designed as a movable sample stage, which is illustrated schematically in FIGS. 2 and 3. Reference is already now made to the fact that the invention is not restricted to the carrier element 11 described here. Rather, the invention can be provided for any embodiment of a movable carrier element.

The carrier element 11 has a sample receptacle 14, on which a sample is arranged. The carrier element 11, embodied as a sample stage, has movement elements which ensure a movement of the carrier element 11 in such a way that a region of interest on the sample can be examined by means of a particle beam. The movement elements are illustrated schematically in FIGS. 2 and 3 and will be explained below.

The carrier element 11 has a first movement element 18 on a housing 16 of a sample chamber, in which the carrier element 11 is arranged and which is connected to the particle beam column 1 (not illustrated). The first movement element renders possible a movement of the carrier element 11 along the z-axis (first translation axis). Furthermore, provision is made for a second movement element 15. The second movement element 15 renders possible a rotation of the carrier element 11 about a first rotation axis 17, which is also referred to as tilt-axis (first rotation axis). This second movement element 15 serves to tilt a sample arranged in the sample receptacle 14 about the first rotation axis 17.

On the second movement element 15, a third movement element 19 is arranged in turn, the latter being embodied as a guide for a carriage and ensuring that the carrier element 11 can move in the x-direction (second translation axis). The aforementioned carriage in turn is a further movement element, namely a fourth movement element 20. The fourth movement element 20 is embodied in such a way that the carrier element 11 can move in the y-direction (third translation axis). To this end, the fourth movement element 20 has a guide, in which a further carriage, on which the sample receptacle 14 is arranged, is guided.

The sample receptacle 14 in turn is embodied with a fifth movement element 21, which renders it possible that the sample receptacle 14 is rotatable about a second rotation axis 22 (second rotation axis). The second rotation axis 22 is oriented perpendicular to the first rotation axis 17.

As a result of the above-described arrangement, the carrier element 11 of the exemplary embodiment discussed here has the following kinematic chain: first movement element 18 (movement along the z-axis)—second movement element 15 (rotation about the first rotation axis 17)—third movement element 19 (movement along the x-axis)—fourth movement element 20 (movement along the y-axis)—fifth movement element 21 (rotation about the second rotation axis 22).

In a further exemplary embodiment (not illustrated here), provision is made for providing further movement elements such that movements are made possible along further translation axes and/or about further rotation axes.

Figure 3:
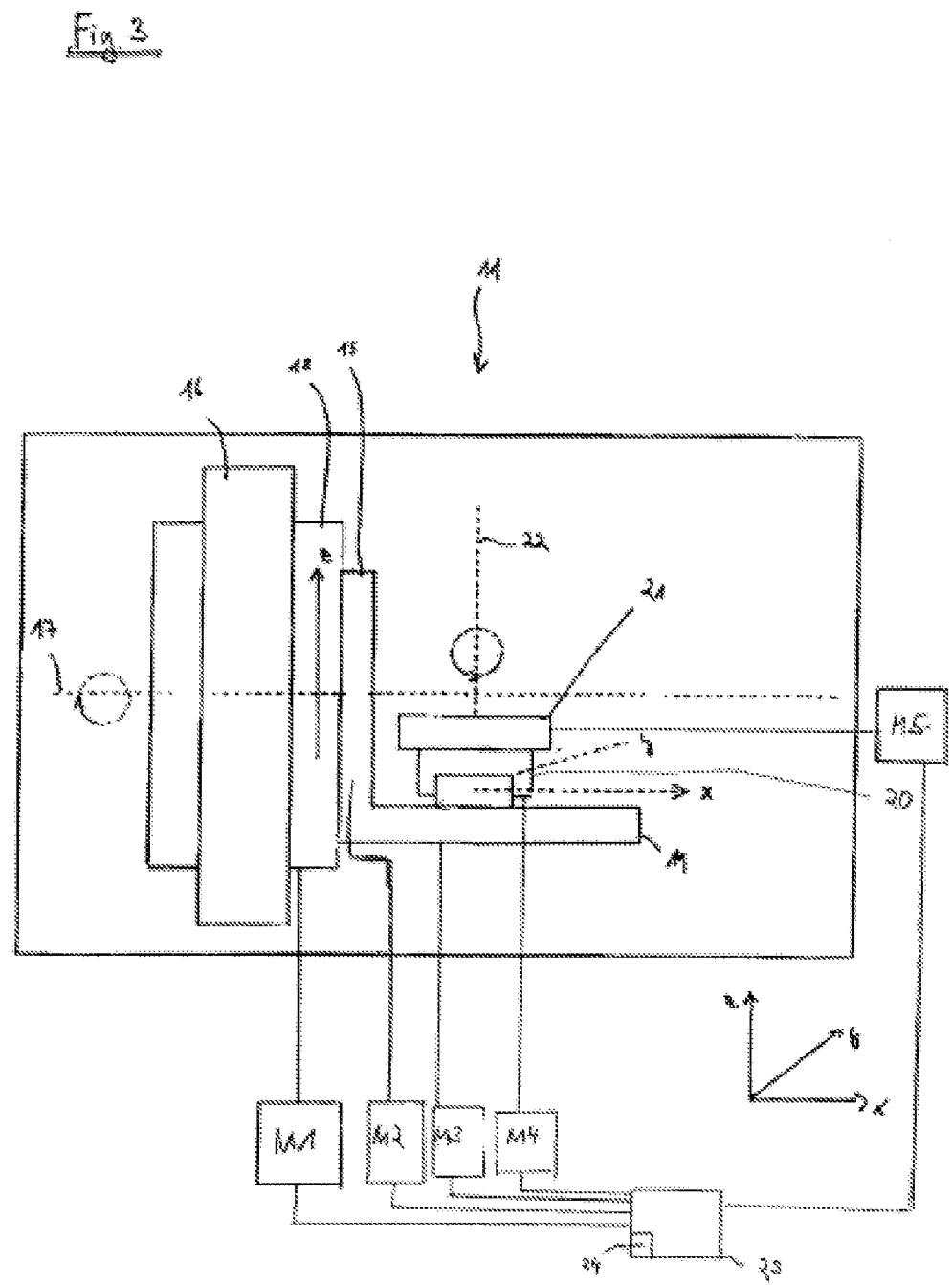
FIG. 3 shows a further schematic illustration of the carrier element as per FIG. 2.

As is evident from FIG. 3, each of the aforementioned movement elements is connected to a stepper motor. Thus, the first movement element 18 is connected to a first stepper motor M1 and driven as a result of a driving force provided by the first stepper motor M1. The second movement element 15 is connected to a second stepper motor M2, which drives the second movement element 15. The third movement element 19 is in turn connected to a third stepper motor M3. The third stepper motor M3 provides a driving force for driving the third stepper motor M3. The fourth movement element 20 is connected to a fourth stepper motor M4, wherein the fourth stepper motor M4 drives the fourth movement element 20. Furthermore, the fifth movement element 21 is connected to a fifth stepper motor M5. The fifth stepper motor M5 provides a driving force, which drives the fifth movement element 21.

The aforementioned stepper motors M1 to M5 are controlled by a control unit 23 (cf. FIGS. 1 and 3). The control unit 23 has a storage unit 24, in which a computer program product is loaded, which executes a method explained further below.

The control unit 23 is connected to an operating unit (not illustrated), which controls the positions of the carrier element 11, which is embodied as sample stage. Here, the operating unit can be used, for example, to enter a new position of the carrier element 11 and hence a new position of the sample. After the entry command, the carrier element 11 then drives to the predetermined new position using the above-described method for actuating the stepper motors. To this end, the required displacement path or the required angular change of the carrier element 11 is used, knowing the step size of the drive (i.e. that displacement path or that tilt angle which is obtained with each step of the relevant stepper motor (M1 to M5)), to calculate the number of steps required for each of the stepper motors M1 to M5 in order to reach the new position. The number of steps within which the acceleration of the carrier element 11 should be carried out, and hence the increase in the amplitudes of the motor currents for each of the stepper motors M1 to M5 should be carried out, and the number of steps within which the deceleration of the carrier element 11 should be carried out and hence the reduction of the amplitudes of the motor currents for each of the stepper motors M1 to M5 to the respective holding current should be carried out, is subsequently determined. Then, the new position is subsequently approached.

Figure 4:
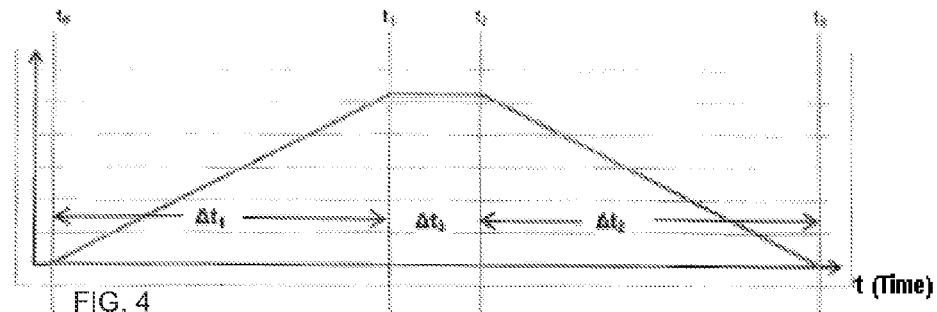
FIG. 4 shows a schematic illustration of a profile of a speed of a stepper motor.
Figure 5:
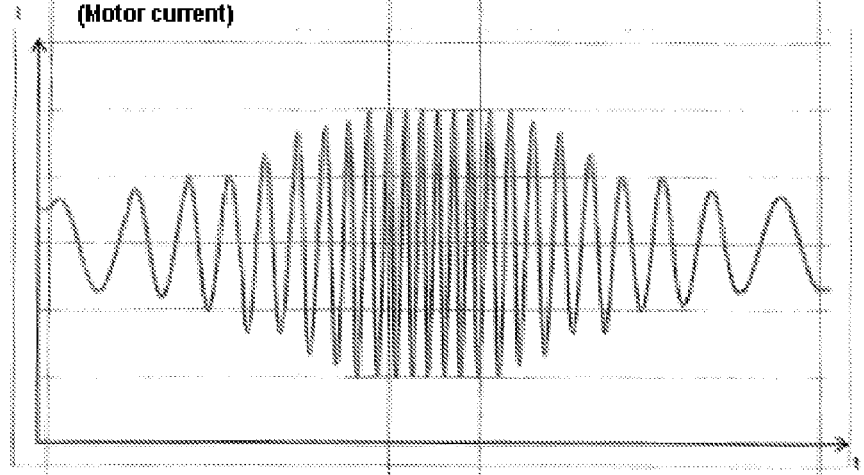
FIG. 5 shows a schematic illustration of a motor current of a stepper motor.
Figure 6:
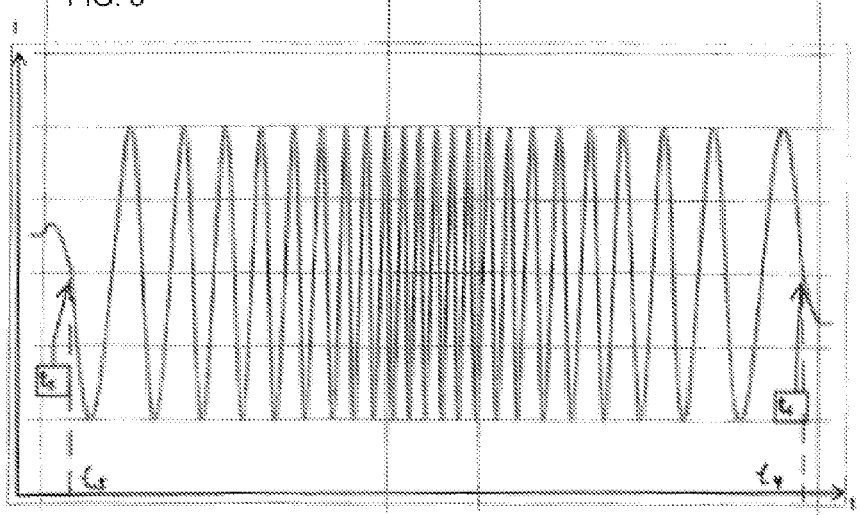
FIG. 6 shows a further schematic illustration of a motor current of a stepper motor.

The method is now explained in an exemplary fashion using FIGS. 4 to 6 on the basis of an actuation of the first stepper motor M1. The further stepper motors M2 to M5 are actuated analogously to the actuation of the first stepper motor M1.

FIG. 4 shows the time profile of the speed of the stepper motor M1 and hence also of the first movement element 18 over a certain amount of time. FIG. 5 shows the profile of the first motor current I, which is fed to a coil of the first stepper motor M1, during this certain amount of time. The first stepper motor M1 has a plurality of coils. The first motor current I is fed to these coils of the first stepper motor M1 with a phase offset.

First of all, at a start time $t_0$, a movement of the carrier element 11 is started by actuating the first stepper motor M1 with the first motor current I configured as an alternating current. The starting of the movement comprises an acceleration of the first stepper motor M1 and hence also of the first movement element 18 during an acceleration phase $\Delta t_1$. The acceleration phase $\Delta t_1$ is a period of time given by the difference between a first time $t_1$ and the start time $t_0$. A target speed V1 is reached at the first time $t_1$. The first motor current I is now set by the control unit 23 in such a way that said current initially has a first acceleration frequency and a first acceleration amplitude during the acceleration phase $\Delta t_1$. The first acceleration frequency and the first acceleration amplitude are increased during the acceleration phase $\Delta t_1$ until a first frequency and a first amplitude of the first motor current I are reached at the first time $t_1$. In the exemplary embodiment in accordance with FIG. 5, the amplitude and the frequency of the first motor current I are continuously increased during the acceleration phase $\Delta t_1$ until the first frequency and the first amplitude of the first motor current I are reached. Although, in a further exemplary embodiment which is illustrated in more detail in FIG. 6, the frequency of the first motor current I is continuously increased during the acceleration phase $\Delta t_1$ until the first frequency is obtained, provision is alternatively made for the amplitude of the first motor current I to be increased abruptly to the first amplitude at a time $t_5$, which is situated within the acceleration phase $\Delta t_1$. In principle, this is an abrupt increase in the amplitude of the first motor current I. Here, the abrupt increase can occur in a single step, or else during a plurality of incremental increases until the first amplitude is reached.

The speed V of the first stepper motor M1 is frequency dependent. Hence, the target speed V1 is dependent on the first frequency of the first motor current I and determined by the latter. The first acceleration frequency and the first acceleration amplitude of the first motor current I are set in such a way that the first frequency is greater than the first acceleration frequency and that the first amplitude is greater than the first acceleration amplitude.

The first frequency and the first amplitude of the first motor current I are kept constant during a setting phase $\Delta t_3$ such that the first stepper motor M1 has the target speed V1 during the setting phase $\Delta t_3$. The setting phase $\Delta t_3$ is given by the difference between a second time $t_2$ and the first time $t_1$.

A deceleration phase $\Delta t_2$, which is given by the difference between a third time $t_3$ and the second time $t_2$, starts at the second time $t_2$. The first stepper motor M1, and hence the carrier element 11 as well, no longer moves at the third time $t_3$. The movement of the carrier element 11 is decelerated during the deceleration phase $\Delta t_2$ by reducing the first frequency and, simultaneously, reducing the first amplitude of the first motor current I, wherein the first frequency is continuously reduced to zero over the whole deceleration phase $\Delta t_2$. The first amplitude of the first motor current I is reduced to an amplitude of a predeterminable first holding current during the same period of time.

According to the exemplary embodiment in accordance with FIG. 5, the first amplitude of the first motor current I is, in the micro-step operation of the first stepper motor M1, also changed over the whole deceleration phase $\Delta t_2$, in which the first frequency of the first motor current I is reduced and set to zero. In the exemplary embodiment illustrated here, the first amplitude of the first motor current I is changed continuously. The first amplitude is reduced during the whole deceleration phase $\Delta t_2$ until the amplitude of the holding current is reached. The first stepper motor M1 is stationary at this holding current. The first motor current I for reaching a holding position is accordingly actuated while the first stepper motor M1 is still in motion, i.e. while the first motor current I still has a frequency which differs from zero.

According to the exemplary embodiment in accordance with FIG. 6, the change in the first amplitude of the first motor current I is not continuous; instead, the amplitude of the first motor current I is reduced from the first amplitude to the amplitude of the holding current at a time $t_4$, which lies within the deceleration phase $\Delta t_2$. In principle, this is an abrupt reduction in the amplitude of the first motor current I. Here, the abrupt reduction can occur in a single step, or else during a plurality of incremental reductions until the amplitude of the holding current is reached. In this embodiment, the reduction in the amplitude of the first motor current I also occurs at a time at which the first motor current I still has a frequency that differs from zero.

As described above, initially proceeding from the respective holding current for each of the stepper motors M1 to M5, the amplitude and the frequency of the motor current are increased within the predetermined number of steps for the acceleration phase until the maximum amplitude and the maximum frequency of the motor current is reached. Subsequently, a motor current with maximum amplitude and frequency is then provided for each of the stepper motors M1 to M5 for the predetermined number of steps—minus the previously predetermined number of steps for the acceleration and the deceleration. Following this, the amplitude and the frequency of the motor current are then, within the predetermined number of steps for the deceleration of the carrier element 11, reduced again for each of the stepper motors M1 to M5 until the amplitude of the motor current once again reaches the holding current and the frequency of the motor current reaches the frequency zero, i.e. until a time-constant motor current with the amplitude of the holding current is provided. A motor current is provided for each winding for each individual stepper motor M1 to M5. Those motor currents which are provided for the various windings of the same stepper motor respectively have the same amplitude and the same frequency but have mutually different phase angles. What this can render possible in the deceleration phase for each of the stepper motors M1 to M5 is that the stepper motor stops in a micro-step position, i.e. in a position between two full steps. If each of the stepper motors M1 to M5 has two windings, each winding is provided with its own motor current, which has the same frequency, but between which there is a phase shift.

That is to say, if the current for the first winding can be expressed as the current I1=A cos ft, the current for the second winding is I2=A cos(ft+phi), where A is the amplitude of the current, f is the frequency of the current, t is the time and phi is the phase shift between the two motor currents. If each of the stepper motors M1 to M5 has more than two windings, a motor current is provided for each of the windings, having the same amplitude and the same frequency, but having different phase shifts. In the acceleration phase and in the deceleration phase, the amplitude A and frequency which are identical for all motor currents for the same stepper motor, are increased or decreased in the deceleration phase. When the holding position is reached, the amplitude A of the motor currents has the value of the holding current, and the motor current for all windings has a frequency of zero. Then, each winding of each stepper motor is actuated by a direct current in the holding phase, with the magnitudes of the direct currents, by means of which the various windings of the same stepper motor are actuated, corresponding to the cosine of the phase shifts with respect to one another.

The method described above for the stepper motor M1 can, as already mentioned above, be extended to all further stepper motors M2 to M5. It is also possible for a plurality of stepper motors to carry out the above-described method simultaneously. This is applied in particular when the control unit 23 is equipped with an operating unit, which allows a simultaneous movement of the carrier element 11 along a plurality of translation axes and also rotation axes. Thus, for example, a joystick or a trackball allows a simultaneous movement in x- and y-directions. Moreover, the magnitude of the deflection of the joystick or the speed of the rotation of the trackball can control the speed of the stepper motors M1 to M5. Here, the holding current is determined for each stepper motor M1 to M5 in such a way that the torque generated by the stepper motor at the holding current is greater than the breakaway torque of the driven mechanical system, which breakaway torque is required for overcoming the static friction of the mechanical system. The amplitude of the holding current should at the same time be 25% to 70%, preferably 40% to 60%, of the amplitude of the traction current.

Here, the amplitude of the holding current is so large that the stepper motor can start from a stationary state at this amplitude of the motor current and is only kept stationary because the frequency of the holding current is zero. When starting the stepper motor from a stationary state, at least the first micro-step is driven with a current amplitude corresponding to the holding current. Thus, the frequency of the motor current is increased first, and only thereafter the amplitude thereof. Correspondingly conversely, the last micro-step prior to reaching the target position is then also once again driven with a motor current, the amplitude of which corresponding to the holding current. Since the amplitude of the motor current is no longer changed after reaching the holding position, this ensures that the motor stops in this position thus set, even if this is a micro-step position of the stepper motor.

Figure 2:
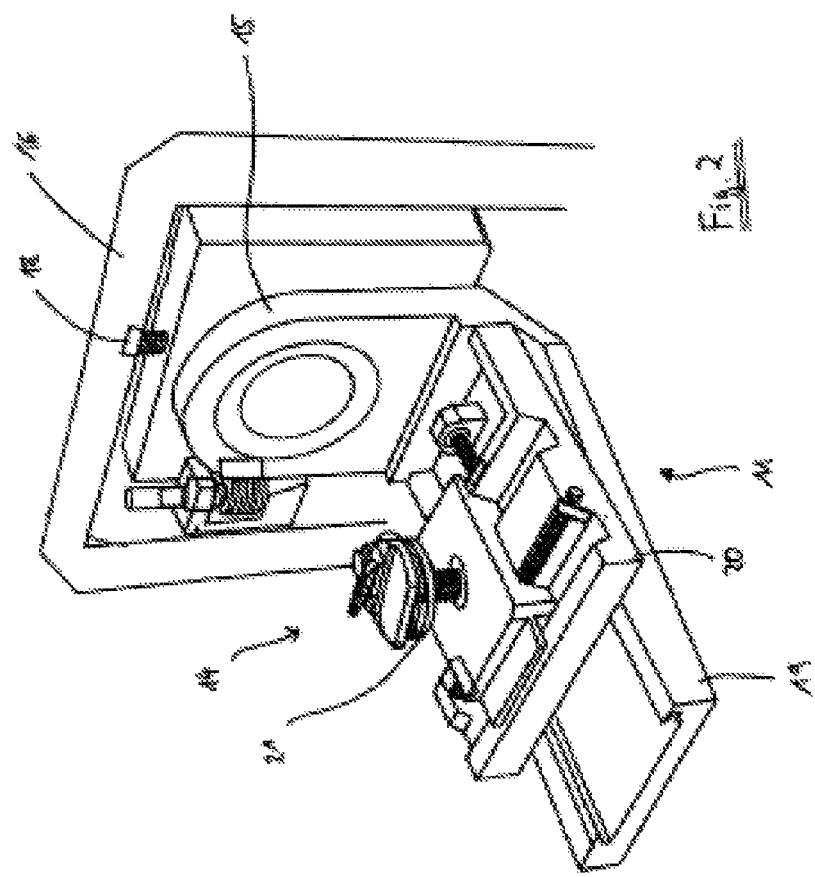
FIG. 2 shows a schematic illustration of a carrier element in the form of a sample stage.

Since the breakaway torques for the movements along or about the various movement axes are different in the exemplary embodiment described on the basis of FIGS. 2 and 3, the amplitudes of the holding currents can be different for the various stepper motors M1 to M5. However, what is true in all stepper motors M1 to M5 is that the amplitude of the motor current is only increased after the stepper motor has moved by at least one micro-step and that the reduction of the amplitude of the motor current to the holding current already takes place before the last micro-step prior to reaching the target position is carried out.

If a movement along or about a plurality of axes is started simultaneously, two different operating modes are, in principle, possible in the exemplary embodiment described on the basis of FIGS. 2 and 3: the so-called standard control and the so-called continuous path control. During the standard control, the maximum possible frequency and amplitude of the motor current is provided after the acceleration phase for each stepper motor M1 to M5. As a consequence, all drives start simultaneously. Each drive stops when the target position is reached for the movement about or along the associated axis. In general, the various drives will then reach their target positions, and stop, at different times. In the case of the continuous path control, all activated drives likewise start simultaneously, but the frequencies of the motor currents for the various axes are adapted to one another in such a way that all activated drives reach their respective target position, and stop, at the same time.

In addition to the above-described specification of the new position, there is also the option of using the operating unit to pre-select a desired speed, by means of which the carrier element 11, and hence the sample stage, should be displaced. In addition to controlling the sample stage by entry of, for example, the positions and the speeds, there preferably also is the option of the operating unit being equipped with a joystick, trackball, keypad or similar operating elements for positional control. Both the start and the end of a movement, and also the direction and the speed of the movement, can be predetermined with the aid of these operating elements. However, initially the frequency, and thereafter also the amplitude, of the respectively actuated motor currents is increased in any case at the start of when the movement is set in motion, i.e. when the operating element is adjusted from the rest position into a displacement position until both the frequency and the amplitude of the motor current reach the maximum value. Likewise, when the operating element once again reaches the rest position, both the frequency and the amplitude of the motor current are reduced until the motor current once again has the amplitude of the holding current and the frequency is zero, i.e. the motor current is once again provided as direct current. Here too, the first micro-step when starting from a stationary state and the last micro-step prior to standstill occur with an amplitude of the respective motor current which corresponds to the respective holding current.

The system described herein renders it possible that each of the stepper motors M1 to M5 (and hence also the carrier element 11) stops at a desired position and there is no longer movement of the stepper motors in the direction of the next full step. Furthermore, the system described herein renders it possible that none of the stepper motors M1 to M5 heat up too much.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A method for setting a position of a carrier element, which is arranged in a particle beam device, wherein the carrier element is designed to hold an object, wherein the particle beam device has at least one beam generator for generating a particle beam and at least one objective for focusing the particle beam, and wherein the carrier element is designed in a movable fashion using at least one first stepper motor, the method comprising:

starting a movement of the carrier element by actuating the first stepper motor using a first motor current in the form of an alternating current;

setting the first motor current to a first frequency and to a first amplitude; and decelerating the movement of the carrier element by reducing the first frequency and by reducing the first amplitude of the first motor current, wherein the first frequency is reduced to zero during a first predeterminable period of time and wherein the first amplitude is reduced to an amplitude of a predeterminable first holding current during the first predeterminable period of time.

2. The method according to claim 1, wherein starting the movement of the carrier element comprises providing an acceleration during a second predeterminable period of time, and wherein the first motor current is actuated using a first acceleration frequency and using a first acceleration amplitude during the second predeterminable period of time, wherein the first acceleration frequency and the first acceleration amplitude are changed during the second predeterminable period of time until the first frequency and the first amplitude are set, and wherein the first frequency is greater than the first acceleration frequency and wherein the first amplitude is greater than the first acceleration amplitude.

3. The method according to claim 1, wherein at least one of: the first frequency or the first amplitude are kept constant over a third predeterminable period of time.

4. The method according to claim 1, wherein the carrier element is moved along at least one of: a first translation axis, a second translation axis, or a third translation axis.

5. The method according to claim 4, wherein the first translation axis and the second translation axis are oriented perpendicular to one another.

6. The method according to claim 5, wherein at least two of: the first translation axis, the second translation axis or the third translation axis are oriented perpendicular to one another.

7. The method according to claim 4, wherein at least one of the following is provided:
   (i) the carrier element is moved along the first translation axis using the first stepper motor,
   (ii) the carrier element is moved along the second translation axis using a second stepper motor, or
   (iii) the carrier element is moved along the third translation axis using a third stepper motor.

8. The method according to claim 7, wherein the movement of the carrier element is a first movement, and wherein the method further comprises:
   starting a second movement of the carrier element by actuating the second stepper motor using a second motor current in the form of an alternating current;
   setting the second motor current to a second frequency and to a second amplitude;
   decelerating the second movement of the carrier element by reducing the second frequency and by reducing the second amplitude of the second motor current, wherein the second frequency is reduced to zero during a fourth predeterminable period of time and wherein the second amplitude is reduced to an amplitude of a predeterminable second holding current during the fourth predeterminable period of time,
   starting a third movement of the carrier element by actuating the third stepper motor using a third motor current in the form of an alternating current;
   setting the third motor current to a third frequency and to a third amplitude; and
   decelerating the third movement of the carrier element by reducing the third frequency and by reducing the third amplitude of the third motor current, wherein the third frequency is reduced to zero during a fifth predeterminable period of time, and wherein the third amplitude is reduced to an amplitude of a predeterminable third holding current during the fifth predeterminable period of time.

9. The method according to claim 8, wherein starting at least one of the movements of the carrier element comprises providing an acceleration during a sixth predeterminable period of time, wherein the second motor current is actuated using a second acceleration frequency and using a second acceleration amplitude during the sixth predeterminable period of time, wherein the second acceleration frequency and the second acceleration amplitude are changed during the sixth predeterminable period of time until the second frequency and the second amplitude are set, and wherein the second frequency is greater than the second acceleration frequency and wherein the second amplitude is greater than the second acceleration amplitude.

10. The method according to claim 8, wherein starting at least one of the movements of the carrier element comprises providing an acceleration during a seventh predeterminable period of time, wherein the third motor current is actuated using a third acceleration frequency and using a third acceleration amplitude during the seventh predeterminable period of time, wherein the third acceleration frequency and the third acceleration amplitude are changed during the seventh predeterminable period of time until the third frequency and the third amplitude are set, and wherein the third frequency is greater than the third acceleration frequency and wherein the third amplitude is greater than the third acceleration amplitude.

11. The method according to claim 8, wherein at least of the following is provided:
   (i) at least one of: the second frequency or the second amplitude is kept constant over an eleventh predeterminable period of time, or
   (ii) at least one of: the third frequency or the third amplitude is kept constant over a twelfth predeterminable period of time.

12. The method according to claim 1, wherein the carrier element is rotated about at least one of: a first rotation axis or a second rotation axis.

13. The method according to claim 12, wherein the first rotation axis and the second rotation axis are oriented perpendicular to one another.

14. The method according to claim 12, wherein at least one of the following is provided:
   (i) the carrier element is rotated about the first rotation axis using a fourth stepper motor, or
   (ii) the carrier element is rotated about the second rotation axis using a fifth stepper motor.

15. The method according to claim 14, wherein the method comprises the following steps:
   starting a fourth movement of the carrier element by actuating the fourth stepper motor using a fourth motor current in the form of an alternating current;
   setting the fourth motor current to a fourth frequency and to a fourth amplitude;
   decelerating the fourth movement of the carrier element by reducing the fourth frequency and by reducing the fourth amplitude of the fourth motor current, wherein the fourth frequency is reduced to zero during an eighth predeterminable period of time, and wherein the fourth amplitude is reduced to an amplitude of a predeterminable fourth holding current during the eighth predeterminable period of time;

starting a fifth movement of the carrier element by actuating the fifth stepper motor using a fifth motor current in the form of an alternating current;

setting the fifth motor current to a fifth frequency and to a fifth amplitude; and decelerating the fifth movement of the carrier element by reducing the fifth frequency and by reducing the fifth amplitude of the fifth motor current, wherein the fifth frequency is reduced to zero during a ninth predeterminable period of time, and wherein the fifth amplitude is reduced to an amplitude of a predeterminable fifth holding current during the ninth predeterminable period of time.

16. The method according to claim 15, wherein at least one of the following is provided:
(i) at least one of: the fourth frequency or the fourth amplitude is kept constant over a thirteenth predeterminable period of time, or
(ii) at least one of: the fifth frequency or the fifth amplitude is kept constant over a fourteenth predeterminable period of time.

17. The method according to claim 15, wherein starting at least one of the movements of the carrier element comprises providing an acceleration during a tenth predeterminable period of time, wherein the fourth motor current is actuated using a fourth acceleration frequency and using a fourth acceleration amplitude during the tenth predeterminable period of time, wherein the fourth acceleration frequency and the fourth acceleration amplitude are changed during the tenth predeterminable period of time until the fourth frequency and the fourth amplitude are set, and wherein the fourth frequency is greater than the fourth acceleration frequency and wherein the fourth amplitude is greater than the fourth acceleration amplitude.

18. The method according to claim 15, wherein starting at least one of the movements of the carrier element comprises providing an acceleration during a fifteenth predeterminable period of time, wherein the fifth motor current is actuated using a fifth acceleration frequency and using a fifth acceleration amplitude during the fifteenth predeterminable period of time, wherein the fifth acceleration frequency and the fifth acceleration amplitude are changed during the fifteenth predeterminable period of time until the fifth frequency and the fifth amplitude are set, wherein the fifth frequency is greater than the fifth acceleration frequency and wherein the fifth amplitude is greater than the fifth acceleration amplitude.

19. A non-transitory computer-readable medium storing software for setting a position of a carrier element, which is arranged in a particle beam device, wherein the carrier element is designed to hold an object, wherein the particle beam device has at least one beam generator for generating a particle beam and at least one objective for focusing the particle beam, and wherein the carrier element is designed in a movable fashion using at least one first stepper motor, the software comprising:

executable code that starts a movement of the carrier element by actuating the first stepper motor using a first motor current in the form of an alternating current;

executable code that sets the first motor current to a first frequency and to a first amplitude; and executable code that decelerates the movement of the carrier element by reducing the first frequency and by reducing the first amplitude of the first motor current, wherein the first frequency is reduced to zero during a first predeterminable period of time and wherein the first amplitude is reduced to an amplitude of a predeterminable first holding current during the first predeterminable period of time.

20. A particle beam device, comprising:
at least one beam generator for generating a particle beam;
at least one objective lens for focusing the particle beam on an object;
at least one detector for detecting interaction particles or interaction radiation, which are generated when the particle beam is incident on the object,
at least one carrier element for arranging the object and at least one stepper motor for moving the carrier element;
at least one control processor that executes software stored on a non-transitory computer-readable medium, the software including:
executable code that starts a movement of the carrier element by actuating the first stepper motor using a first motor current in the form of an alternating current;
executable code that sets the first motor current to a first frequency and to a first amplitude; and
executable code that decelerates the movement of the carrier element by reducing the first frequency and by reducing the first amplitude of the first motor current, wherein the first frequency is reduced to zero during a first predeterminable period of time and wherein the first amplitude is reduced to an amplitude of a predeterminable first holding current during the first predeterminable period of time.

21. A particle beam device, comprising:
at least one beam generator for generating a particle beam;
at least one objective lens for focusing the particle beam on an object;
at least one detector for detecting interaction particles or interaction radiation, which are generated when the particle beam is incident on the object,
at least one carrier element for arranging the object and at least one stepper motor for moving the carrier element,
wherein the particle beam device is configured in such a way that:
a movement of the carrier element is started by actuating the first stepper motor using a first motor current in the form of an alternating current,
the first motor current is set to a first frequency and to a first amplitude, and
the movement of the carrier element is decelerated by reducing the first frequency and by reducing the first amplitude of the first motor current, wherein the first frequency is reduced to zero during a first predeterminable period of time, and wherein the first amplitude is reduced to an amplitude of a predeterminable first holding current during the first predeterminable period of time.

* * * * *